United States Patent
Aubert

(10) Patent No.: US 7,990,143 B2
(45) Date of Patent: Aug. 2, 2011

(54) NMR MACHINE COMPRISING SOLENOID GRADIENT COILS

(75) Inventor: Guy Aubert, Poitiers (FR)

(73) Assignee: Commissariat a l'Energie Atomique et Aux Energies Alternatives, Paris (FR)

( * ) Notice: Subject to any disclaimer, the term of this patent is extended or adjusted under 35 U.S.C. 154(b) by 382 days.

(21) Appl. No.: 12/084,083

(22) PCT Filed: Oct. 26, 2006

(86) PCT No.: PCT/FR2006/051115
§ 371 (c)(1),
(2), (4) Date: Apr. 24, 2008

(87) PCT Pub. No.: WO2007/048983
PCT Pub. Date: May 3, 2007

(65) Prior Publication Data
US 2009/0140737 A1    Jun. 4, 2009

(30) Foreign Application Priority Data
Oct. 26, 2005    (FR) .................................... 05 10950

(51) Int. Cl.
*G01V 3/00*    (2006.01)
(52) U.S. Cl. .......................... 324/318; 324/319; 324/309
(58) Field of Classification Search .......... 324/300–322; 600/410, 411, 322, 423; 333/219
See application file for complete search history.

(56) References Cited

U.S. PATENT DOCUMENTS

| | | | |
|---|---|---|---|
| 4,689,563 A * | 8/1987 | Bottomley et al. | 324/309 |
| 5,530,355 A | 6/1996 | Doty | |
| 5,764,059 A | 6/1998 | Mansfield et al. | |
| 7,403,009 B2 * | 7/2008 | Aubert | 324/318 |
| 7,468,644 B2 * | 12/2008 | Axel | 333/219 |
| 7,786,730 B2 * | 8/2010 | Aubert | 324/318 |
| 2007/0052418 A1 * | 3/2007 | Aubert | 324/318 |
| 2009/0096451 A1 * | 4/2009 | Aubert | 324/318 |
| 2009/0140737 A1 * | 6/2009 | Aubert | 324/309 |
| 2010/0102813 A1 * | 4/2010 | Schulz et al. | 324/318 |

FOREIGN PATENT DOCUMENTS

| | | |
|---|---|---|
| EP | 1 286 173 A2 | 2/2003 |
| WO | WO 2005/029110 A2 | 3/2005 |
| WO | WO2007/048983 * | 5/2007 |

* cited by examiner

*Primary Examiner* — Melissa J Koval
*Assistant Examiner* — Tiffany A Fetzner
(74) *Attorney, Agent, or Firm* — Weingarten, Schurgin, Gagnebin & Lebovici LLP

(57) ABSTRACT

The nuclear magnetic resonance machine comprises a device (101) for creating an intense main magnetic field $B_0$ in a useable interior space (109) in the form of a tunnel with axis Z, a device for radio-frequency excitation and processing of radio-frequency signals emitted in response by a body (150) placed in the useable interior space (109), and a set (110) of solenoidal gradient coils for superimposing on the intense magnetic field $B_0$ components of an additional magnetic field, the gradient coils (111-122) being incorporated into tubes that are disposed in a annular cylindrical space (130). Between an exterior cryogenic enclosure (102) and the annular cylindrical space (130) a cylindrical screen (104) is disposed along the axis Z comprising a conductive material of low resistance and low magnetoresistance such that negligible induced currents are generated in the exterior cryogenic enclosure (102) while the eddy currents induced in the cylindrical screen (104) contribute to reinforcing the gradients produced by the solenoidal gradient coils (111-122).

19 Claims, 4 Drawing Sheets

NMR MACHINE COMPRISING SOLENOID GRADIENT COILS

This application is a §371 national phase filing of PCT/FR2006/051115 filed Oct. 26, 2006, and claims priority to French application No. 05 10950 filed Oct. 26, 2005.

The present invention relates to nuclear magnetic resonance (NMR) machines comprising solenoidal gradient coils that are incorporated into tubes with improved access, and it relates more particularly to NMR machines that compensate eddy currents generated by the gradient coils.

The invention relates generally to NMR machines that can be used for magnetic resonance imaging (MRI) in the medical field in particular.

NMR machines can have a tunnel-type structure with a central space reserved for the patient and an annular structure that has to integrate, firstly means for creating an intense main magnetic field $B_0$ in the central observation space, these means generally consisting of a superconductor main magnetization coil placed in a cryostat, or where appropriate a permanent magnet, and, secondly radio-frequency excitation means (transmit antennas) and means for processing radio-frequency signals re-emitted in response to radio-frequency excitation sequences by the body of a patient placed in the central observation space.

To be able to distinguish between the radio-frequency signals re-emitted in response to radio-frequency excitation sequences and to create an image, gradient coils superimpose additional magnetic fields on the intense main field, which is homogeneous, the additional magnetic fields being of values that are a function of the 3D coordinates of the points at which they are applied.

This function conventionally uses three orthogonal axes X, Y, Z with the Z axis being generally collinear with the intense field $B_0$. Each point in space can thus be "coded" with a different field value and the resulting modifications in the re-emitted signal can be processed to produce the image.

Acquiring an image therefore requires conjoint application of field gradient sequences during application of the radio-frequency excitation sequences. Whichever imaging method is adopted, one characteristic of field gradients is that they are pulsed.

Diverse examples of gradient coil systems for NMR machines are given in patent documents FR 2 588 997 and FR 2 621 125, for example. For high-quality NMR imaging, the real field gradients must be homogeneous, i.e. must conform, with a given tolerance, to a theoretical ideal distribution that is to be imposed. To increase the homogeneity of the gradients produced, the gradient coils must be as large as possible, but for reasons of overall size and power the size of these gradient coils must also not be unduly increased, which means that designing these gradient coils is subject to contradictory requirements.

Moreover, the temporary character of the gradient pulses also makes it necessary to solve problems linked to the pulsed nature of the field, over and above the problem of the linearity of the field that these gradient coils produce.

Thus for NMR machines with a high-intensity orientation field, in particular, it is necessary to have detectable high-frequency NMR signals, for example signals at a frequency of the order of 426 megahertz (MHz) for NMR machines operating at around 10 teslas. The gradient coils must then be able to produce a gradient slope of the order of 100 milliteslas per meter (mT/m) to 150 mT/m, for example.

These more powerful gradients give rise to problems of various types. Firstly, the power dissipation of gradient coils capable of producing such slopes is very high: of the order of a few tens of kilowatts (kW). It is therefore necessary to provide efficient cooling so that these gradients do not overheat the patient and the cryostat containing the superconductor main magnetization coil.

Moreover, fast imaging sequences used at present include gradient pulses of duration that is of the order of a few milliseconds (ms) and of rise and fall times that must be 1 ms or less.

With the electrical powers employed, the gradient coils, located in the orientation field of the machine, are subjected to very violent accelerations caused by electromagnetic forces. Those accelerations quickly cause the machine to deteriorate and also produce noise that is intolerable for the patient who is being examined. The noise constraint is moreover particularly difficult when, in order to examine the brain in particular, the aim is to show up those areas of the brain that are stressed during some particular intellectual activity. It is then difficult to ask a patient to undertake some particular intellectual activity (for example mentally doing operations of addition or multiplication) at the same time as submitting them to a frightening noise that prevents them from concentrating.

Even if this type of experiment could be envisaged on humans, pre-clinical experiments on animals are not possible if the animals are stressed by such noise.

All these problems must be solved allowing for the fact that, to leave a sufficiently large usable examination volume, the overall size of the gradient coils is limited. For example, it should be recalled that because it is now standard practice in this field, the usable examination volume is located in a tunnel of circular section having a diameter that must have a value of approximately 550 millimeters (mm), the gradient coils having to fit into an annular space between this usable tunnel volume and the volume inside the panels of the cryostat. This volume inside the cryostat constitutes a circular tunnel with a diameter of approximately 1000 mm.

To produce gradients whilst taking the above problems into account, patent document WO2005/029110 has already proposed dedicating the available annular space to accommodating tubes into which circular solenoidal coils are inserted. The tubes are preferably contiguous with one another and form a layer of tubes.

Disposing the coils in the tubes yields the intended result of producing high-intensity gradients, as a result of enhanced cooling, conformance to linearity constraints imposed by specifications, reduced acoustic noise, and to a certain extent limitation of eddy currents.

The elimination of noise is a result of inserting the solenoidal coils into tubes with axes parallel to the main field and loading them only radially relative to their own structure, the torsor that results from the electromagnetic stresses being zero.

Having a field orientation perpendicular to the standard gradient coils, the proposed structures, in particular those for the X and Y gradients, produce much lower eddy currents in the screens or the various metal panels of the cryostat than previous implementations.

However, these eddy currents can continue to constitute a problem in certain circumstances, in particular by overheating the cryostat, which increases the consumption of cryogenic fluid.

Moreover, disposing standard screens between gradient generators and the cryostat of the main magnet reduces the electric fields produced outside the screens by the gradient generators.

However, reducing the induced currents in this way makes the gradients less effective and makes it even more difficult to produce intense gradients with fast switching in an intense main field.

Patent document U.S. Pat. No. 5,530,355 discloses an NMR machine in which, to produce gradients, coils are also used having axes that are generator lines of a cylinder of axis corresponding to the direction of the main magnetic field. For improved linearity, that document nevertheless recommends the use of non-solenoidal coils, which makes implementation more complex.

Furthermore, patent document U.S. Pat. No. 5,764,059 describes an example of an acoustic and magnetic screen usable in magnetic resonance imaging machines in association with standard structures for producing gradients with horseshoe-shaped coils for the x and y gradients and Maxwell turns for the z gradient. Since it is then necessary to provide both x gradient coils and y gradient coils, the presence of those coils on the same general former limits the space available for each of those two sets of coils to two cylindrical sectors each subtending an angle of $\pi/2$, which in practice prevents obtaining the required gradient linearity.

An object of the invention is to eliminate the drawbacks referred to above and in particular to improve the accessibility of an NMR machine, in particular for imaging the brain in which only the head of a patient is observed, using a "head gradient" system of dimensions that are much smaller than those for magnetic resonance imaging (MRI) examination of the whole body of a patient.

Another object of the invention is to reduce the drawbacks linked to the generation of eddy currents by the gradient generators.

According to the invention, these objects are achieved by a nuclear magnetic resonance machine comprising means for creating an intense main magnetic field $B_0$ in a usable interior space in the form of a tunnel with axis Z, means for radio-frequency excitation and for processing radio-frequency signals emitted in response by a body or object placed in said usable interior space, and a first set of solenoidal gradient coils for superimposing on the intense magnetic field $B_0$ components of an additional magnetic field, said gradient coils being incorporated into tubes disposed parallel to the axis Z in a annular cylindrical space situated between an exterior cryogenic enclosure containing said means for creating an intense magnetic field $B_0$ and said usable interior space, the diameter of the gradient coils being inscribed in a thickness of said annular cylindrical space, the solenoidal gradient coils of the first set being adapted to produce a first or X field gradient in a first radial direction x of the machine perpendicular to the axis Z and a second or Y field gradient in a second radial direction y of the machine also perpendicular to the axis Z, the first direction x being perpendicular to the second direction y, and the machine including amplifiers for simultaneously energizing said solenoidal coils with algebraic sums of currents corresponding to the two gradients, characterized in that the annular cylindrical space includes on an external wall thereof annular coils for producing a magnetic field gradient oriented parallel to the direction of the main magnetic field $B_0$ whereas the solenoidal coils producing X and Y field gradients in directions perpendicular to the direction Z of the main magnetic field $B_0$ are all disposed within the thickness of the annular cylindrical space, and in that the solenoidal gradient coils incorporated in tubes constitute individual sources of X and Y field gradients in directions perpendicular to the direction of the axis Z, which are sized as forming part of a set of N contiguous individual sources distributed at the perimeter of the annular cylindrical space, where $N=4\upsilon+2$, $\upsilon$ being an integer greater than or equal to 1, but where two diametrically opposite individual sources corresponding to an axial plane xOz are omitted to retain only $4\upsilon$ contiguous individual sources distributed in two subsets separated by gaps, each tube being provided with one individual source.

The machine further comprises between said exterior cryogenic enclosure and said annular cylindrical space an additional annular cylindrical space in which is disposed a second set of solenoidal gradient coils that are incorporated in tubes disposed parallel to the axis Z and in that the direction of the pulsed currents in the solenoidal gradient coils of said second set is reversed relative to the direction of the pulsed currents in the solenoidal gradient coils of said first set to create reverse direction field gradients that reduce the vector potential and the eddy currents induced in the exterior cryogenic enclosure.

The number of solenoidal gradient coils of the second set can be identical to the number of solenoidal gradient coils of the first set, but this is not essential and these numbers can be different.

By means of the compensation effected by the second set of coils disposed in a ring concentrically around the first set of coils, the magnetic vector potential generated in the surrounding conductors is reduced, especially in the walls of the cryostat of the main magnet, with no penalty of reducing the field gradient produced by the first set of coils in the usable volume in which the patient is placed.

According to one particular embodiment, the additional annular cylindrical space includes on an external wall thereof annular coils for producing a magnetic field gradient oriented in the direction of the main magnetic field $B_0$, whereas the solenoidal coils producing X, Y field gradients in directions perpendicular to the direction z of this main magnetic field are all disposed within the thickness of the additional annular cylindrical space.

In another particular embodiment, the invention concerns a nuclear magnetic resonance machine comprising means for creating an intense main magnetic field $B_0$ in a usable interior space in the form of a tunnel with axis Z, means for radio-frequency excitation and for processing radio-frequency signals emitted in response by a body or object placed in said usable interior space, and a first set of solenoidal gradient coils for superimposing on the intense magnetic field $B_0$ components of an additional magnetic field, said gradient coils being incorporated into tubes disposed parallel to the axis Z in a annular cylindrical space situated between an exterior cryogenic enclosure containing said means for creating an intense magnetic field $B_0$ and said usable interior space, the diameter of the gradient coils being inscribed in a thickness of said annular cylindrical space, characterized in that it further comprises between said exterior cryogenic enclosure and said annular cylindrical space an additional annular cylindrical space in which is disposed a second set of solenoidal gradient coils that are incorporated into tubes disposed parallel to the axis Z, in that the direction of the pulsed currents in the solenoidal gradient coils of said second set is reversed relative to the direction of the pulsed currents in the solenoidal gradient coils of said first set so as to create field gradients in the reverse direction that reduce the vector potential and the eddy currents induced in the exterior cryogenic enclosure, in that the solenoidal gradient coils of the first and second sets are adapted to produce a first or X field gradient in a first radial direction x of the machine perpendicular to the axis Z and a second or Y field gradient in a second radial direction y of the machine also perpendicular to the axis Z, the first direction x being perpendicular to the second direction y, in that the machine includes amplifiers for simultaneously energizing said solenoidal coils with algebraic sums of currents corresponding to the two gradients, in that a solenoidal coil whose diameter is inscribed in the annular cylindrical space and that produces a Z field gradient in a direction z parallel to the main field $B_0$ is coaxial with another solenoidal coil inscribed in the same tube of this annular cylindrical space and producing an X field gradient in a direction x perpendicular to the direction, and in that a solenoidal coil whose diameter is inscribed in the additional annular cylindrical space and that produces a Z field gradient in a direction parallel to the main field $B_0$ is coaxial with another solenoidal coil inscribed in the same tube of this additional annular cylindrical space and producing an X field gradient in a direction x perpendicular to the direction z.

According to an advantageous feature, which in particular provides more room for the shoulders of a patient or for instrumentation, the solenoidal gradient coils incorporated in tubes constitute individual sources of X, Y, and Z gradients that are sized as forming part of a set of N contiguous individual sources distributed at the perimeter of the annular cylindrical space, where $N=4\upsilon$, $\upsilon$ being an integer in the range 2 to 4, but where one in two individual sources is omitted so as to retain only $2\upsilon$ non-contiguous individual sources, each tube being provided with one individual source.

If it is not necessary to provide more room for the shoulders of a patient, in one possible embodiment the solenoidal coils are distributed at the perimeter of the annular space in 2n arrangements of coaxial solenoidal coils where n is an integer greater than or equal to 3 and preferably in the range 4 to 9.

In another possible embodiment the solenoidal coils are distributed at the perimeter of the annular space or the additional annular cylindrical space in 2n arrangements of coaxial solenoidal coils, a number of coils being energized simultaneously by combinations of currents to produce an X and/or Y and/or Z gradient, n being an integer greater than or equal to 3 and preferably in the range 4 to 9.

In one embodiment, a component of a current that flows in a coil to produce a gradient is proportional to a nominal current multiplied by the cosine of an angle that identifies the coil on the perimeter of the annular space.

In another embodiment, a component of a current that flows in a coil to produce a gradient is proportional to a nominal current multiplied by a coefficient of 1, 0.732, or 0.268 as a function of an angle that identifies the coil on the perimeter of the annular space.

In one particular embodiment, the annular space has contiguous tubes distributed at its perimeter to receive the solenoidal coils, the radius a of a tube being given by $a=r1(\sin \pi/N)/(1-\sin \pi/N)=r2(\sin \pi/N)/(1+\sin \pi/N)$, where N represents the number of tubes and r1 and r2 the inside and outside radii, respectively, of the annular space.

Solenoidal coils are energized by individual electrical power supplies.

The solenoidal coils are advantageously formed of elongate helicoidal turns, preferably of rectangular profile, along circular conductive sleeves, sleeves of the same coil being concentric and engaged one within another.

There is then preferably an annular space for cooling fluid between two sleeves.

These features are applicable to the solenoid gradient coils of the first set as well as to the solenoid gradient coils of the second set.

Other features and advantages of the invention emerge from the following description of particular embodiments, given by way of example with reference to the appended drawings in which.

Figure 1:
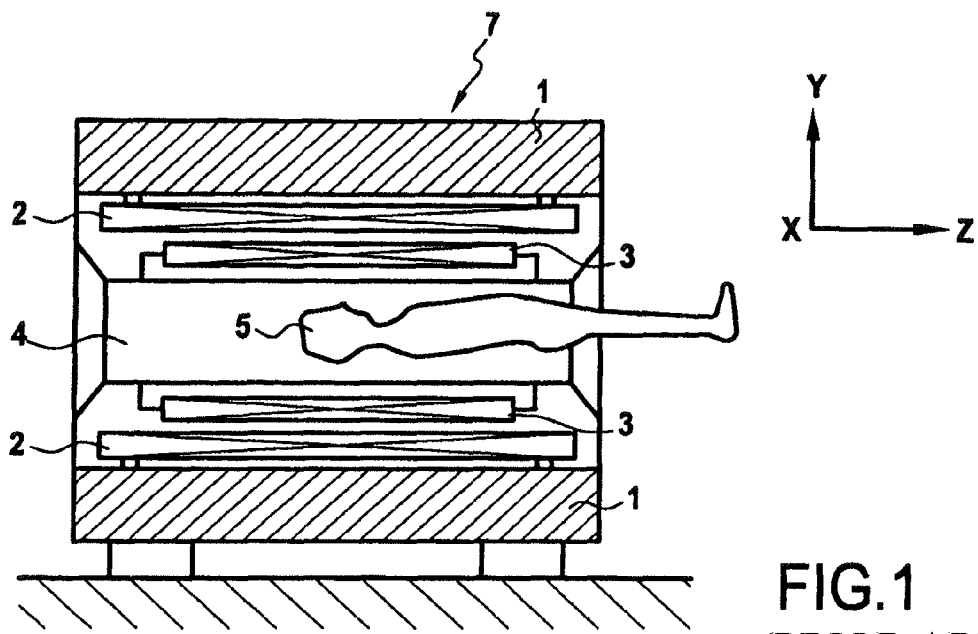
FIG. 1 is a diagram showing an NMR machine in longitudinal section.

FIG. 1 shows very diagrammatically the theory of an NMR machine 7 with a device 1 for creating a homogeneous and intense main magnetic field $B_0$ essentially parallel to the axis Z of a tunnel 4 in which a patient 5 is placed.

The device shown in FIG. 1 for creating an intense main magnetic field $B_0$ can comprise permanent magnets. However, this device may preferably comprise a superconductor magnet placed in a cryostat intended to maintain the superconductor magnet at a very low temperature. In any event, the device 1 for creating an intense magnetic field is placed in a cylindrical annular external enclosure that provides an annular space between the inside wall of this external enclosure and the tunnel 5 in which the patient 5 to be examined is placed. The cylindrical annular external enclosure generally has metal walls, for example stainless steel walls.

In this annular space situated inside the device 1 for creating an intense main magnetic field there are disposed gradient coils 2 intended to create magnetic field gradients both in the direction of the axis Z of the tunnel 4 and in directions X and Y perpendicular to each other and to the axis Z.

As indicated above, the gradient coils 2 provide a way of coding the space in which the patient 5 is placed by applying pulsed additional magnetic fields.

The components of these magnetic fields that are not oriented like the orientation field $B_0$ have only a second order contribution to the modification of the usable NMR signal (and therefore a negligible contribution with the values of $B_0$ and the gradients considered here). Thus the only component of the magnetic fields produced by the gradient coils that is of interest and useful is the component oriented along the field $B_0$. This usable component is usually referred to as the Bz or $B_z$ component. The coordinates of points inside the machine are defined relative to a Cartesian system of axes, the axis z being collinear with the direction of the uniform field $B_0$ and parallel to the generator lines of the tunnel machine. Depending on the sets of gradient coils that are energized, the useful component Bz at one location increases in amplitude as a function of the abscissa x of a plane containing that location, parallel to the plane yOz for the X gradients, as a function of the ordinate y of a plane containing that location, parallel to the plane xOz for the Y gradients, or as a function of the dimension z of a plane containing that location, parallel to the plane xOy for the Z gradients.

A system of radio-frequency transmit antennas 3 is disposed in the vicinity of the tunnel 4 in which the patient is placed or inserted directly into the tunnel. The radio-frequency transmit antennas or coils are conventionally associated with devices for receiving and processing radio-frequency signals emitted in response by the body of the patient 5 or by any other object under study, for example an animal.

Figure 2:
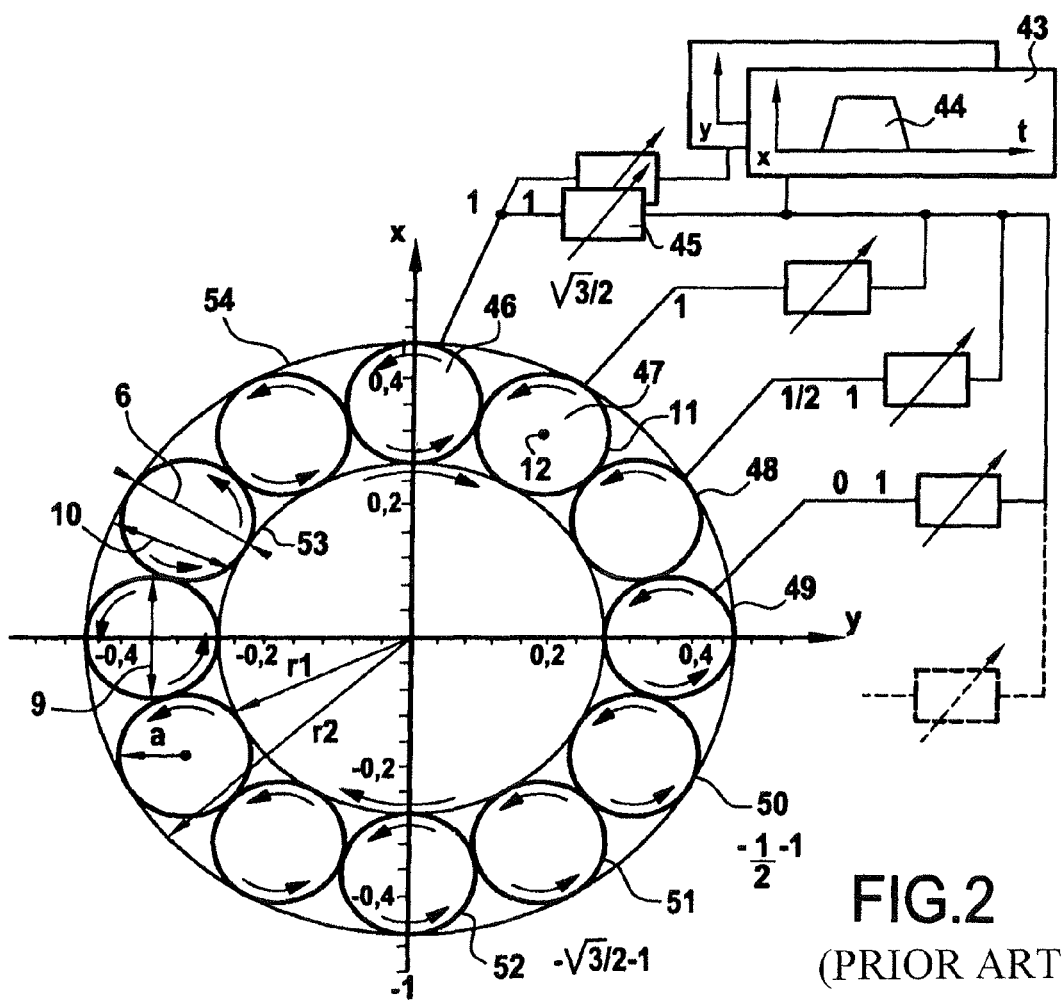
FIG. 2 is a diagram showing an NMR machine to which the invention can be applied in section perpendicular to the axis of the tunnel and the main field.

FIG. 2 shows the cylindrical annular space 6 including circular solenoidal coils whose diameter 9, of value 2a, is inscribed within a thickness 10 of this annular space 6 defined by cylindrical walls 53, 54 having respective radii r1 and r2. It can initially be assumed that the thickness 10 of the annular space 6 is equal to the total thickness of that space. In the example shown, the annular space 6 is therefore occupied by twelve tubes consisting of panels 11 made from a plastics material or some other electrically insulative material. Inside the tubes 11 are coils for producing gradient magnetic fields, which coils can be produced as described in the document WO 2005/029110. The tubes are preferably contiguous with each other.

Each tube can be fitted with a set of coils exactly identical to the set of any other tube. This set of coils is advantageously capable of producing a Z gradient and a gradient in a chosen direction perpendicular to the axis Z. The coils can be controlled to produce gradients of X or Y orientation.

In the example shown, the number of tubes can be even (2n) to produce X or Y gradients and Z gradients. However, one particular embodiment could comprise an even number of first tubes to contain solenoidal coils to produce X or Y gradients and an odd number of second tubes to contain coils to produce Z gradients.

A few basic concepts useful for understanding the invention are explained below.

Note firstly that any point M in space can be identified by its Cartesian coordinates (x, y, z) or its polar coordinates (r, υ, ϕ), where:

$$\vec{r} = OM \; r = |\vec{r}|$$

$$x = r \sin \theta \cos \phi$$

$$y = r \sin \theta \sin \phi$$

$$z = r \cos \theta$$

In the volume of interest around the origin O the main field $\vec{B_0}$ is substantially uniform and directed along the following axis Oz:

$$\vec{B_0} \approx B_0 \vec{u_z}.$$

In a region of space that is "magnetically" empty (i.e. in which there are no electric currents or materials of non-negligible magnetic susceptibility), each component $B_x$, $B_y$ and $B_z$ has a zero Laplace operator. For example, whatever the sources of the field, $\Delta B_z = 0$ and $B_z(\vec{r})$ has a unique expansion in spherical harmonics of the form:

$$B_z(r, \theta, \varphi) = Z_0 + \sum_{n=1}^{\infty} r^n \left[ \begin{array}{c} Z_n P_n(\cos\theta) + \\ \sum_{m=1}^{n} \left( \begin{array}{c} X_n^m \cos m\varphi + \\ Y_n^m \sin m\varphi \end{array} \right) W_n^m P_n^m(\cos\theta) \end{array} \right]$$

In the above equation $W_n^m$ is a numerical weighting factor such that $|W_n^m P_n^m(\cos \theta)| \leq 1$, such as $|P_n(\cos \theta)|$.

This expansion is valid only for $r < r_{max}$, the radius of the largest "magnetically" empty sphere with center O. The coefficients of degree n (m is referred to as the order) are of the form $\alpha r_{max}^{-n}$ where $\overline{\alpha}$ has the dimension of a field and the rate of convergence of the expansion is proportional to the difference between r and $r_{max}$.

Producing images from NMR signals requires three dimensional space to be coded by means of specific field sources of components $b_z$ that should ideally be of the form $b_z = g_x x$, $b_z = g_y y$, and $b_z = g_z z$, where $g_x$, $g_y$, and $g_z$ are proportional to the excitation currents of their respective sources. They are referred to for short as the x gradient, the y gradient, and the z gradient, respectively.

In practice, such linearity can be achieved only approximately with sources that generate fields $\vec{b}$ with non-zero components $b_x$ and $b_y$. Happily, this does not matter if $|\vec{b}| \ll B_0$, which is practically always so. The resonant frequency is proportional to:

$$|\vec{B}| = \sqrt{(B_0 + b_z)^2 + b_x^2 + b_y^2}$$

$$= B_0 \sqrt{1 + 2\frac{b_z}{B_0} + \frac{b^2}{B_0^2}}$$

$$\simeq B_0 + b_z + \frac{b_x^2 + b_y^2}{2B_0} + \dots$$

$$= B_0 + b_z + B_0 \times O\left(\frac{b}{B_0}\right)^2$$

Thus only the component $b_z$ is operative at the level of the ppm provided that $$\frac{b}{B_0} \leq \sim 10^{-3}.$$

Applied to the production of magnetic field gradients, the principle of symmetry shows that the symmetry properties of the field source concerned lead to zero values of certain coefficients of the spherical harmonic expansion mentioned above, whatever the way in which it might have been produced.

The generation of magnetic field gradients for MRI has produced a considerable body of publications and patents and is still the subject of intensive research. The most modern imaging methods, in particular functional imaging, require gradients that are as linear as possible, that are ever more powerful, and that are switchable very quickly, while the main field in which they are to function is ever more intense. Faced with the corresponding problems of cooling, isolation, and acoustic noise, the active and reactive powers necessary become considerable.

The problems caused by currents induced in conductors in the vicinity of the gradient generators also become ever more difficult to solve.

Of course, all known systems use the results of applying the principle of symmetry. However, it is possible to go much further in canceling certain coefficients of the spherical harmonic expansion by combining individual sources energized by currents linked by appropriate relationships of proportionality.

Consider a current distribution that is antisymmetrical relative to the plane xOz and either antisymmetrical (AA) or symmetrical (AS) relative to the plane xOy.

A simple distribution of this kind consists, for example, of a set of solenoidal coils with the same axis O'z' parallel to the axis Oz, at a distance d therefrom. The Cartesian coordinates for the center O' of this set that is antisymmetrical or symmetrical relative to the plane xOy are (d, 0, 0), with one or the other of the following two configurations:

the set (AA) comprises an even number of solenoidal coils on either side of the plane xOy, the geometrically symmetrical solenoidal coils carrying currents turning in opposite directions about the axis O'z' (the simplest case therefore comprises two antisymmetrical solenoidal coils);

the set (AS) comprises any number of solenoidal coils, the solenoidal coils that are geometrically symmetrical relative to the xOy plane carrying currents turning in the same direction about the axis O'Z' (the simplest case therefore comprises a single solenoidal coil with xOy as the plane of symmetry).

More complex configurations can be envisaged, however, for example coils with non-circular sections and around a plurality of axes O'z'. The only conditions to be complied with are the symmetry properties symbolized by (AA) or (AS).

Consider either of these sets carrying a current I and let P be the corresponding dissipated power.

By direct application of the principle of symmetry, a set (AA) produces in the region of interest a field whose non-zero expansion terms are in the form:

$$Z_{2p+1} \forall p \geq 0$$

$$X_n^m \forall m \geq 1, n=m+2l+1 \forall l \geq 0$$

It is shown in the same way that a set (AS) carrying a current I produces in the region of interest a field whose non-zero expansion terms are of the form:

$$Z_{2p} \forall p \geq 0$$

$$X_n^m \forall m \geq 1, n=m+2l \forall l \geq 0$$

The following principles can be used to produce a Z gradient generator.

Consider N identical individual sources of type (AA) carrying the same current I and regularly distributed around the axis Oz. The coordinates of the traces $O'_j$ of their axes on the plane xOy are therefore:

$$\varphi_j = \varphi_0 + j\frac{2\pi}{N}$$

$$j \in [0, N-1]$$

in which $\phi_0$ is any origin azimuth.

The expansion in terms of spherical harmonics of the component z of the total field produced is the sum of the expansions of type (AA) appropriately offset in azimuth $\phi$:

$$B_z(r, \theta, \varphi) = \sum_{p=0}^{\infty} r^{2p+1} N Z_{2p+1} P_{2p+1}(\cos\theta) +$$

$$\sum_{m=1}^{\infty}\sum_{l=0}^{\infty} r^{m+2l+1} X_{m+2l+1}^m \left[\sum_{j=0}^{N-1} \cos m(\varphi - \varphi_j)\right] W_{m+2l+1}^m P_{m+2l+1}^m(\cos\theta)$$

The sums between square brackets are calculated as follows:

$$\sum_{j=0}^{N-1} \cos m(\varphi - \varphi_j) = \sum_{j=0}^{N-1} \cos\left[m(\varphi - \varphi_0) - j\frac{2m\pi}{N}\right]$$

$$= \left[\sum_{j=0}^{N-1} \cos j\frac{2m\pi}{N}\right]\cos m(\varphi - \varphi_0) + \left[\sum_{j=0}^{N-1} \sin j\frac{2m\pi}{N}\right]\sin m(\varphi - \varphi_0)$$

$$= \begin{cases} 0, & m \neq kN \\ N\cos m(\varphi - \varphi_0), & m = kN \end{cases} \forall k \geq 1$$

The expansion of the total field therefore reduces to:

$$B_z(r, \theta, \varphi) = N\left[\sum_{p=0}^{\infty} r^{2p+1} Z_{2p+1} P_{sp+1}(\cos\theta) + \sum_{k=1}^{\infty}\sum_{l=0}^{\infty} r^{kN+2l+1} X_{kN+2l+1}^{kN} \cos kN(\varphi - \varphi_0) W_{kN+2l+1}^{kN} P_{kN+2l+1}^{kN}(\cos\theta)\right]$$

for a total dissipated power equal to NP.

In practice, it suffices to make N fairly large, for example N=12 or more, so that the contributions of the terms in $r^{kN+2l+1} X_{kN+2l+1}^{kN}$ are entirely negligible and the expansion reduces to:

$$B_z(r, \theta, \varphi) \simeq N\sum_{p=0}^{\infty} r^{2p+1} Z_{2p+1} P_{2p+1}(\cos\theta)$$

$$= NZ_1 z + N\sum_{p=1}^{\infty} r^{2p+1} Z_{2p+1} P_{2p+1}(\cos\theta)$$

The linearity of the generator of the z gradient obtained in this way improves as more terms of degree 2p+1, p=1, 2, etc. of the expansion are cancelled. This no longer depends on considerations of symmetry but on the actual distribution of the currents in the individual source.

In a simple embodiment of the individual source based on coaxial solenoidal coils, with a minimum of two solenoidal coils geometrically symmetrical relative to the plane xOy and carrying opposite currents, their dimensions and their positions can be chosen to cancel $Z_3$, the first term governing linearity defects then being $Z_5$. With four solenoidal coils with appropriately chosen dimensions and positions, $Z_3$ and $Z_5$ can be cancelled, the first term governing linearity defects becoming $Z_7$, and so on.

In seeking to optimize this kind of generator, other considerations can be introduced such as minimizing the continuous power necessary to obtain a given permanent gradient or minimizing the inductance to allow shorter rise times with a given maximum voltage or adaptation to available power supplies or amplifiers. It is important to note that this production principle greatly facilitates use of a plurality of power supplies or amplifiers, thereby reducing their unit power.

The production in accordance with the same principles of an x gradient generator (for a y gradient generator the reasoning is the same with a rotation of $$\frac{\pi}{2}$$

about Oz) is equally possible and proves just as effective for obtaining the required linearity.

An even number N=2n of individual sources of type (AS) regularly arranged about the axis Oz must be used, the plane xOz being a plane of symmetry of the whole. This latter element of symmetry imposes that the origin azimuth $\phi_0$ be 0 or $$\frac{\pi}{2n}.$$

The coordinates of the traces $O'_j$ of their axes on the plane xOy are therefore:

$$\varphi_j = j\frac{\pi}{n}, \text{ i.e. } \varphi_j = \frac{\pi}{2n} + j\frac{\pi}{n} j \in [0, 2n-1].$$

It is then shown that if the individual sources are energized by currents $I_j = I \cos \varphi_j$, the expansion in spherical harmonics of the component $\bar{z}$ of the total field produced for a total dissipated power equal to nP reduces to:

$$B_z(r, \theta, \varphi) = n \begin{bmatrix} \sum_{p=0}^{\infty} r^{2p+1} X_{2p+1}^{-1} \cos\varphi W_{2p+1}^1 P_{2p+1}^1(\cos\theta) + \\ \left[ \begin{array}{c} 1 \\ (-1)^k \end{array} \right] \sum_{k=1}^{\infty} \sum_{l=0}^{\infty} r^{2kn-1+2l} X_{2kn-1+2l}^{2kn-1} \cos(2kn-1) \\ \varphi W_{2kn-1+2l}^{2kn-1} P_{2kn-1+2l}^{2kn-1}(\cos\theta) + \\ \left[ \begin{array}{c} 1 \\ (-1)^k \end{array} \right] \sum_{k=1}^{\infty} \sum_{l=0}^{\infty} r^{2kn+1+2l} X_{2kn+1+2l}^{2kn+1} \cos(2kn+1) \\ \varphi W_{2kn+1+2l}^{2kn+1} P_{2kn+1+2l}^{2kn+1}(\cos\theta) \end{bmatrix}$$

The calculation is similar to that described above with the following sums to be calculated:

$$\sum_{j=0}^{2n-1} \cos\varphi_j \cos m\varphi_j = \left\{ \begin{array}{l} 0, m \neq 2kn \pm 1 \\ \left[ \begin{array}{c} 1 \\ (-1)^k \end{array} \right], m = 2kn \pm 1 \end{array} \right\}$$

$$\sum_{j=0}^{2n-1} \cos\varphi_j \sin m\varphi_j = 0 \forall m$$

The factor $(-1)^k$ corresponds to the origin azimuth being $$\frac{\pi}{2n}.$$

As for the z gradient, it suffices to choose N=2n (n being an integer) large enough for the contributions of the terms in $$r^{2kn\pm 1+2l} X_{2kn\pm 1+2l}^{2kn\pm 1}$$

to be entirely negligible and for the expansion to reduce to:

$$B_z(r, \theta, \varphi) = n \sum_{p=0}^{\infty} r^{2p+1} X_{2p+1}^1 \cos\varphi W_{2p+1}^1 P_{2p+1}^1(\cos\theta)$$

$$= nX_1^1 x + n \sum_{p=1}^{\infty} r^{2p+1} X_{2p+1}^1 \cos\varphi W_{2p+1}^1 P_{2p+1}^1(\cos\theta)$$

The linearity of the x gradient generator obtained in this way increases as more terms of degree 2p+1, p=1, 2, etc. of the expansion are cancelled. This no longer depends on considerations of symmetry but on the actual distribution of the currents in the individual source.

In a simple embodiment of the individual source based on coaxial solenoidal coils, with a minimum of only one solenoidal coil, none of the coefficients $X_{2p+1}^1 \forall p \geq 1$ can be cancelled. At least two solenoidal coils symmetrical relative to the plane xOy and their dimensions and their positions can be chosen to cancel $X_3^1$, the first term governing linearity defects then being $X_5^1$. With three solenoidal coils with appropriately chosen dimensions and positions, $X_3^1$ and $X_5^1$ can be cancelled, the first term governing linearity defects then being $X_7^1$, and so on.

As for the z gradient generator, optimizing the system involves considering the continuous dissipated power and the inductance. Although for the former there could be only one power supply with all the individual sources in series, since the current would be the same for all, here at least as many supplies will be needed (in absolute value) as there are different current values.

Another very important aspect of this kind of device is that the same individual sources can produce the x gradient and the y gradient without it being necessary to install two physically separate sets as in prior art systems, in particular those described in the document U.S. Pat. No. 5,530,355.

Thus each individual source is energized by the algebraic sum of the currents necessary for the simultaneous production of two required gradient values, using the above formulas. However, note that although the currents and gradients add algebraically, the same does not apply to the dissipated powers, which it is important to calculate for each individual source as a function of the gradient sequences to be produced.

As the values of the x and y gradients must be controlled separately, in the end at least n separate power supplies are required, i.e. one power supply for each pair of individual sources antisymmetrical relative to the Oz axis.

Finally, for the best use of the limited space available for the gradient generators, the same number of individual sources can be adopted firstly for the x and y gradients, and secondly for the z gradient, by producing a composite individual source (AS) and (AA). In a simple implementation of an individual source of this kind based on coaxial solenoidal coils, it is possible for example to combine two solenoidal coils, symmetrical relative to the plane xOy, with dimensions and positions appropriately chosen to cancel $X_3^1$, and four solenoidal coils, antisymmetrical two by two relative to the plane xOy, on either side of each of the previous two solenoidal coils, with dimensions and positions appropriately chosen to cancel $Z_3$ and $Z_5$.

FIG. 2 shows that, for an X gradient, in order to energize the gradient coils an electronic circuit 43 produces a temporal pulse 44 having a shape (rise time, fall time) and a duration required by an imaging sequence to be used with the NMR machine. The signal 44 representing the pulse is introduced into a variable gain amplifier 45.

A data processing system that manages the sequences causes the amplifier 45 to apply a nominal current multiplied by a coefficient which here has the value 1 for the coils situated in a tube 46 situated in the plane xOz.

A tube 47 contiguous with the tube 46 whose axis, here the axis 12, is situated in a plane passing through the axis z and inclined at π/6 relative to the plane xOz, is energized by a current multiplied by a coefficient having the value √3/2. For a tube 48 contiguous with the tube 47 and again offset therefrom by π/6, the current is multiplied by ½. For a tube 49 contiguous with the tube 48 and situated in a plane yOz, the coefficient has the value 0. For a tube 50 symmetrical with the tube 48, the coefficient has the value −½, for a tube 51 symmetrical with the tube 47, it has the value −√3/2, and for a tube 52 symmetrical with the tube 46 relative to the axis Z, the coefficient has the value −1. For tubes on the left in the figure and symmetrical to the tubes 46 to 52 relative to the plane xOz, the values of the coefficients are the same (negative below the axis Y, positive above the axis Y).

The current in a coil is therefore proportional to the cosine of the angle identifying the tube on the perimeter of the circular space that contains it. In one embodiment this distribution of the currents can equally be offset by 15°.

Figure 3:
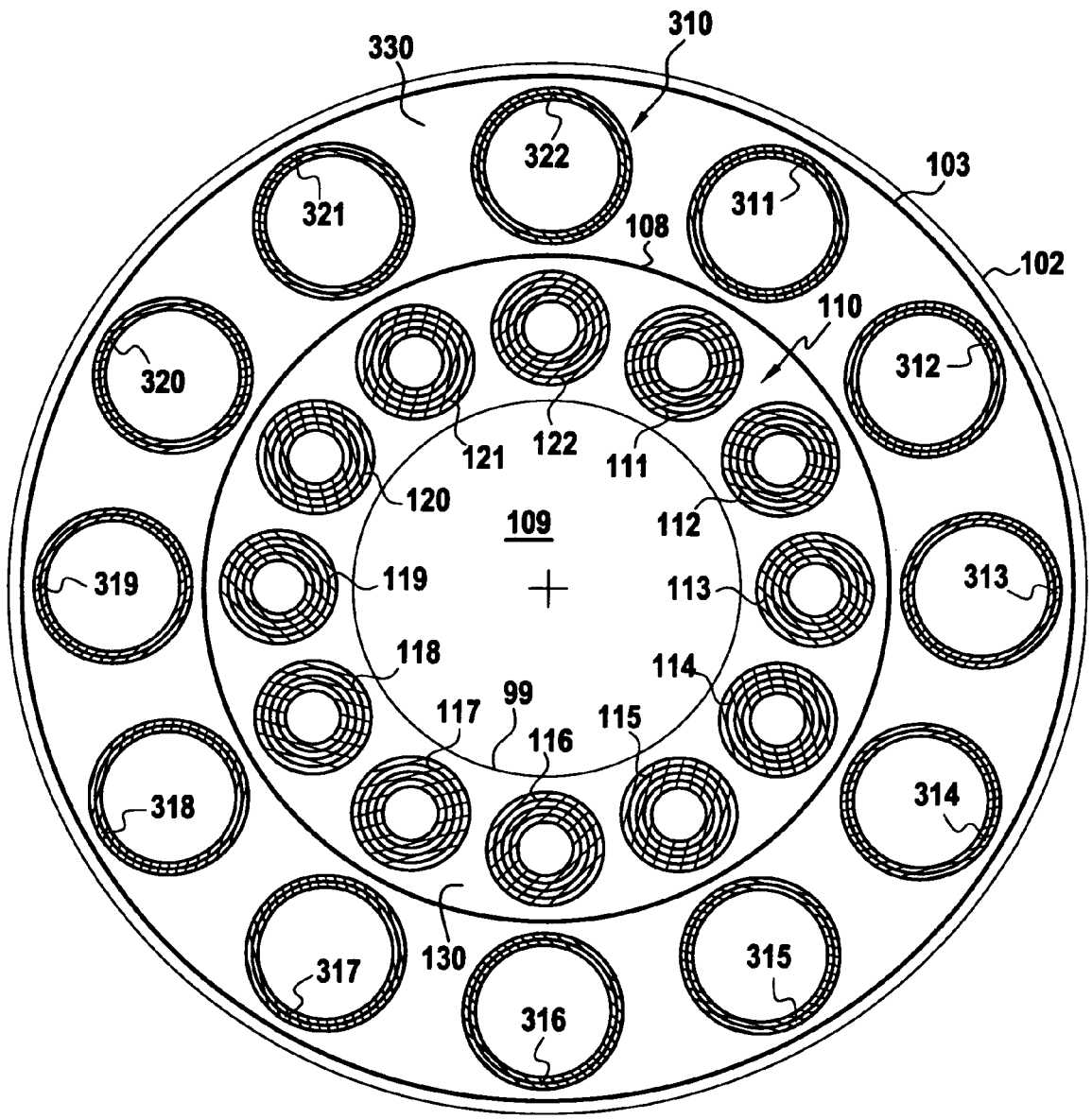
FIG. 3 is a diagram showing an NMR machine of the invention in section perpendicular to the axis of the tunnel.

FIG. 3 shows one particular embodiment of the invention in which, between the internal wall, for example of stainless steel, of the exterior cryogenic enclosure 102 incorporating the device for creating the main magnetic field $B_0$ and the wall 99 defining a usable interior space 109 in the form of a tunnel intended to receive a patient and with the axis Z, there are found not only an annular cylindrical space 130 intended to receive a set 110 of solenoidal gradient coils 111 to 122 contained in tubes with axes parallel to the axis z, and that can be produced in the manner described above, but also an additional annular space 330 in which is disposed a second set 310 of circular solenoidal gradient coils that are incorporated in tubes disposed parallel to the axis z.

The direction of the pulsed currents in the circular solenoidal gradient coils 311 to 322 of the second set 310 is reversed relative to the direction of the pulsed currents in the circular solenoidal gradient coils 111 to 122 of the first set 110 so as to create field gradients in the reverse direction that reduce the vector potential and the eddy currents induced in the exterior cryogenic enclosure 102.

In the FIG. 3 example, there is the same number of tubes equipped with solenoidal gradient coils in the first set 110 and in the second set 310. This number is equal to 12, for example, but can advantageously be in the range 8 to 18. It is furthermore not essential for the sets 110 and 310 to comprise the same number of tubes.

In FIG. 3 it is seen that the gradient coils 111 to 122 of the first set 110 are regularly distributed in the angular space 130 and practically contiguous to one another. The gradient coils 311 to 322 of the second set 310 are also regularly distributed in the annular space 330 with gaps between two adjacent coils. The coils 311 to 322 could also be disposed contiguously to one another and, conversely, the coils 111 to 122 could equally not be disposed contiguously alongside one another. However, for reasons of efficiency, it is preferable for the gradient coils 111 to 122 of the first set 110 to be contiguous when they generate the usable field and are disposed in an annular cylindrical space of smaller diameter, whereas the gradient coils 311 to 322 of the second set 310, which have no compensation function and are located in a annular cylindrical space 330 of greater diameter, can be disposed non-contiguously to reduce the cost.

The second set 310 of gradient coils 311 to 322 can be produced in accordance with the same principles as the first set 110 of gradient coils 111 to 122. In particular, the gradient coils 111 to 122 can produce gradients along the axes x, y, and z if there is an even number of them, or these coils can produce gradients only along the axes x and y, the gradients along the axis z being produced by conventional coils disposed in the cylinder 103 in the vicinity of the wall 102 of the cryostat.

Whilst preserving all the advantages of the technology using circular solenoidal gradient coils disposed in tubes and that can be cooled easily, the presence of the second set 310 of gradient coils 311 to 322 results in particularly effective reduction of the induced currents that would otherwise appear in all the conductive elements of the system, especially the panels of the cryostat of the main magnet and its heat shields, and which cause dissipation of heat increasing the consumption of cryogenic fluid in the cryostat. The invention also reduces the acoustic noise created by the induced currents and limits distortion of the gradients that it is required to produce.

As indicated above, the invention can be applied to NMR machines in which the gradient coils 111 to 122 are such that a circular solenoidal coil whose diameter is inscribed in the annular cylindrical space 130 and that produces a Z field gradient in a first direction z is coaxial with another solenoidal coil inscribed in the same tube of this annular cylindrical space 130 and produces an X field gradient in a direction x inclined relative to the direction z.

The invention can nevertheless be applied in the same way to NMR machines in which only the solenoidal gradient coils 111 to 122 producing X, Y field gradients in directions perpendicular to the direction z are disposed in tubes within the thickness of the annular cylindrical space 130, whereas to produce the Z field gradient a more conventional solution is adopted whereby annular coils for producing a magnetic field gradient oriented along a generatrix of the machine are disposed on an external wall 108 of this annular space 130 rather than inside it. The standard solutions for creating a Z field gradient have fewer disadvantages than those for creating X, Y field gradients.

In this configuration, where the compensation coils are concerned, a device can be used in which only the solenoidal coils 311 to 322 producing X, Y field gradients in directions perpendicular to the direction z are disposed in tubes within the thickness of the additional annular cylindrical space 330, whereas a more conventional solution is adopted for producing the Z field gradient whereby annular coils for producing a magnetic field gradient oriented along a generatrix of the machine are disposed on an external wall 103 of that additional annular cylindrical space 330 rather than inside it.

Figure 5:
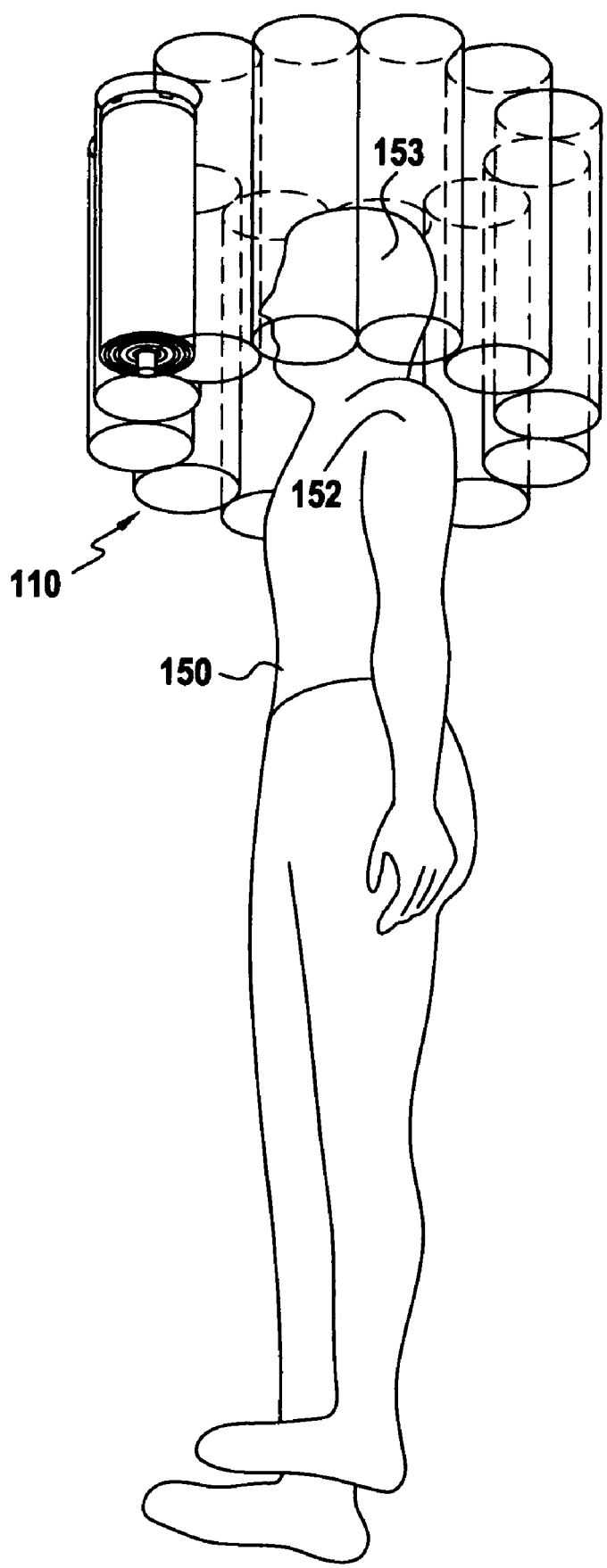
FIG. 5 is a diagrammatic perspective view showing an application to "head gradient" examination.

The efficiency $$\frac{G}{\sqrt{P}}$$

of the gradient generators under steady state conditions (where G is the field gradient produced for a dissipated power P) increases as the source currents approach the volume of interest. The inductance is also reduced if the dimensions of the generator are smaller. This is why specific systems are produced for imaging the brain, known as "head gradients", with dimensions much smaller than those for "whole body gradients". FIG. 5 shows diagrammatically an example with a patient 150 with only their head 153 inserted into the volume of interest in which the set 110 of gradient coils operates. Certain contradictions between the geometrical constraints resulting both from the Maxwell equations, and from the morphology of the human body, could be eliminated if space were freed up for the passage of the shoulders 151, 152 of the person to be examined. It is assumed that this person is placed so that they are stretched out along the axis Oz and the "axis" of their shoulders is in the plane xOz and parallel to Ox.

In order to provide a free passage for the shoulders 151, 152, a configuration of the gradient generators is considered with $N=2n$ individual sources of origin azimuth $\phi_0=0$ in which the two individual sources corresponding to $\phi_j=0$ and $\phi_j=\pi$ are eliminated. It is then still possible to find combinations of individual source currents that yield the best possible linearity with an acceptable reduction of efficiency.

When the z gradient generator consists of circular solenoidal coils placed in the annular space 130, starting from a configuration with N=2n individual sources with $\phi_0=0$, one source in two is eliminated.

If the integer number n is sufficiently large, linearity is always governed by the structure of the individual source. The efficiency $$\frac{G}{\sqrt{P}}$$

is merely divided by $\sqrt{2}$.

This being so, room has been provided not only for the shoulders 151, 152 of the patient, but also in other directions, which correspond to the other sources eliminated, which can have a benefit in terms of accessibility or accommodating ancillaries.

Where the x and y gradient generator consisting of circular solenoidal coils placed in the annular space 130 is concerned, a distinction must be drawn between two cases according to whether n is even or odd.

n even

If n=2υ, the solution is the same as for the z gradient. If υ is sufficiently large, linearity is always governed by the structure of the individual source and the efficiency $$\frac{G}{\sqrt{P}}$$

is merely divided by $\sqrt{2}$.

n odd n=2υ+1 implies effectively eliminating only the two individual sources corresponding to the passage of the shoulders, and new relations between the currents from the remaining sources must be established. It will nevertheless be noted that for the y gradient nothing has changed compared to the situation with no elimination of sources since the two individual sources eliminated were not energized at that time. The linearity and the efficiency of this y gradient are therefore preserved.

For the x gradient the following aspects must be taken into account: the coordinates of the traces O'$_j$ of the axes of the additional sources in the xOy plane are now $$\varphi_j = j\frac{\pi}{2\upsilon+1} \; j \in [1,2\upsilon] \cup [2\upsilon+2, 4\upsilon+1]$$

and the best possible linearity is obtained with currents:

$$I_j = I[\cos\phi_j - (-1)^j]$$

The calculations replace $\cos\phi_j$ with $\cos\phi_j - (-1)^j$ in the sums to be calculated and taking into account the fact that the summation over j can be extended, from 0 to $2n-1=4\upsilon+1$ since j=0 and j=2υ+1 corresponding to the individual sources eliminated yield $\cos\phi_j - (-1)^j = 0$.

Thus, with a dissipated power equal to 3nP:

$$B_z(r, \theta, \varphi) = n \begin{bmatrix} \sum_{p=0}^{\infty} r^{2p+1} X^1_{2p+1} \cos\varphi W^1_{2p+1} P^1_{2p+1}(\cos\theta) - \\ 2\sum_{k=1}^{\infty}\sum_{l=0}^{\infty} r^{(2k-1)n+2l} X^{(2k-1)n}_{(2k-1)n+2l} \cos(2k-1)n\varphi W^{(2k-1)n}_{(2k-1)n+2l} \\ P^{(2k-1)n}_{(2k-1)n+2l}(\cos\theta) + \\ \sum_{k=1}^{\infty}\sum_{l=0}^{\infty} r^{2kn-1+2l} X^{2k-1}_{2k-1+2l} \cos(2kn-1)\varphi W^{2k-1}_{2k-1+2l} \\ P^{2kn-1}_{2kn-1+2l}(\cos\theta) + \\ \sum_{k=1}^{\infty}\sum_{l=0}^{\infty} r^{2kn+1+2l} X^{2k+1n}_{2k+1n+2l} \cos(2kn+1)\varphi W^{2kn+1}_{2kn+1+2l} \\ P^{2kn+1}_{2kn+1+2l}(\cos\theta) \end{bmatrix}$$

The linearity is therefore worse than that of the y gradient with new non-zero terms in $X^{(2k-1)n}_{(2k-1)n+2l}$, in particular that of the lowest degree $X_n^n$, but it suffices to make n large enough in order to guarantee the required quality. The efficiency under permanent conditions is merely divided by $\sqrt{3}$.

There is therefore a choice between two possible configurations that provide accessibility at the level of the shoulders 151, 152 of a patient.

The individual sources can be rated as though there were to be provided a number of them that is a multiple of 4, N=4υ, and in fact only one in two, i.e. 2υ, installed. This solution is valid for the gradients in the three directions and for each of them reduces the efficiency by a factor $\sqrt{2}$ compared to the situation that would apply if N=4υ sources had been installed, and allows use of combined individual sources for the axes x, y and z.

The individual sources can also be rated as though a number N=4υ+2 of them were to be imposed and in fact only 4υ (references 211 to 222 in FIG. 4) installed by eliminating the two individual sources corresponding to the passage of the shoulders 151, 152 in the plane xOz. The y gradient is then identical to what would have been obtained with all the sources whereas the x gradient has its efficiency reduced by a factor $\sqrt{3}$. There is no solution of this type for the z gradient, which under these conditions must be installed in a space external to that occupied by the set 210 of previous sources and therefore requires no further particular arrangements for the passage of the shoulders.

Figure 4:
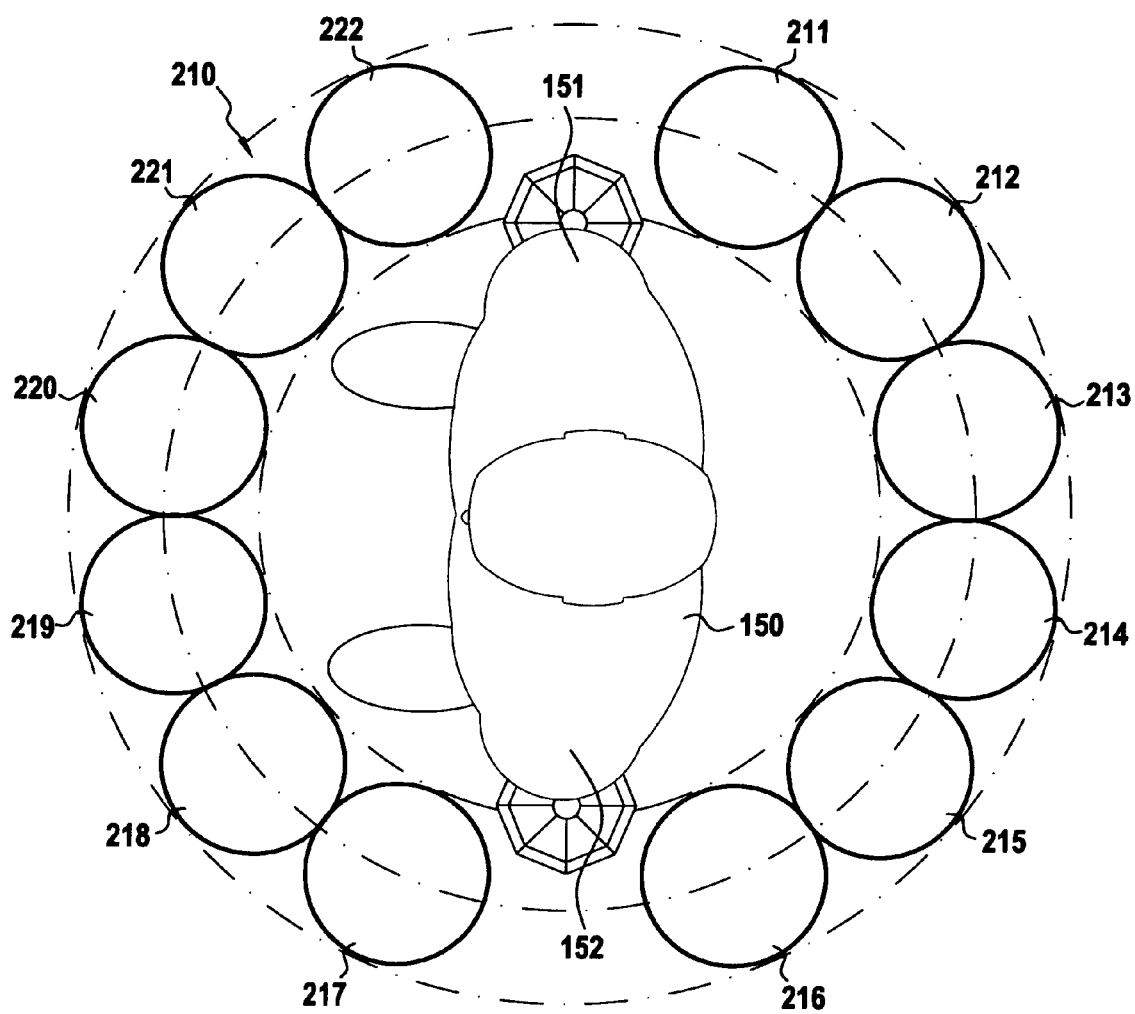
FIG. 4 is a diagram showing part of an NMR machine of the invention adapted to free up localized space in section perpendicular to the axis of the tunnel.

The above considerations naturally apply to the first set 210 of solenoidal gradient coils 211 to 222, shown on their own in FIG. 4. The set 310 of solenoidal gradient coils 311 to 322 that merely provide compensation and are unchanged are not shown in FIG. 4.

The measures proposed above for facilitating the passage of the shoulders 151, 152 of a patient 150 are nevertheless particularly advantageous in combination with a set 310 of compensation gradient coils, since they minimize the drawbacks of the annular cylindrical space 330 used by this set 310 of compensation gradient coils.

The invention claimed is:

1. A nuclear magnetic resonance machine comprising
means for creating an intense main magnetic field $B_0$ in a usable interior space in the form of a tunnel with axis Z;
means for radio-frequency excitation and means for processing radio-frequency signals emitted in response by a body or object placed in said usable interior space, and
a first set of solenoidal gradient coils configured for superimposing on the intense magnetic field $B_0$ components of an additional magnetic field, said gradient coils being incorporated into tubes disposed parallel to the axis Z in an annular cylindrical space situated between an exterior cryogenic enclosure containing said means for creating an intense magnetic field $B_0$ and said usable interior space, the diameter of the gradient coils being inscribed in a thickness of said annular cylindrical space, the solenoidal gradient coils of the first set being configured to produce a first or X field gradient in a first radial direction (x) of the NMR machine perpendicular to the axis Z and a second or Y field gradient in a second radial direction (y) of the machine also perpendicular to the axis Z, the first direction (x) being perpendicular to the second direction (y); and the NMR machine including amplifiers configured for simultaneously energizing said solenoidal coils with algebraic sums of currents corresponding to the two gradients, characterized in that the annular cylindrical space includes on an external wall thereof annular coils configured for producing a magnetic field gradient oriented parallel to the direction of the main magnetic field $B_0$ whereas the solenoidal coils producing X and Y field gradients in directions perpendicular to the direction z of the main magnetic field $B_0$ are all disposed within the thickness of the annular cylindrical space; and in that the solenoidal gradient coils incorporated in tubes constitute individual sources of X and Y field gradients in directions perpendicular to the direction of the axis Z, which are sized as forming part of a set of N contiguous individual sources distributed at the perimeter of the annular cylindrical space, where $N=4\upsilon+2$, $\upsilon$ being an integer greater than or equal to 1, but where two diametrically opposite individual sources corresponding to an axial plane xOz are omitted to retain only $4\upsilon$ contiguous individual sources distributed in two subsets separated by gaps, each tube being provided with one individual source.

2. A NMR machine according to claim 1,
characterized in that it further comprises between said exterior cryogenic enclosure and said annular cylindrical space an additional annular cylindrical space in which is disposed a second set of solenoidal gradient coils that are incorporated in tubes disposed parallel to the axis Z and
characterized in that the direction of the pulsed currents in the solenoidal gradient coils of said second set is reversed relative to the direction of the pulsed currents in the solenoidal gradient coils of said first set in order to create reverse direction field gradients that reduce the vector potential and the eddy currents induced in the exterior cryogenic enclosure.

3. A NMR machine according to claim 2, characterized in that the number of solenoidal gradient coils incorporated in all the tubes of the second set is identical to the number of solenoidal gradient coils incorporated in all the tubes of the first set.

4. A NMR machine according to claim 2, characterized in that the number of solenoidal gradient coils incorporated in all the tubes of the second set is different from the number of solenoidal gradient coils incorporated in all the tubes of the first set.

5. A NMR machine according to claim 2, characterized in that the additional annular cylindrical space includes on an external wall thereof annular coils configured for producing a magnetic field gradient oriented in the direction of the main magnetic field $B_0$ whereas the solenoidal coils producing X, Y field gradients in directions perpendicular to the direction z of this main magnetic field are all disposed within the thickness of the additional annular cylindrical space.

6. A NMR machine according to claim 1,
characterized in that the annular space includes contiguous tubes distributed at the perimeter in order to receive the solenoidal coils, the radius a of a tube being given by $a=r1(\sin \pi/N)/(1-\sin \pi/N)=r2(\sin \pi/N)/(1+\sin \pi/N)$, in which formula N represents the number of tubes and r1 and r2 the inside and outside radii, respectively, of the annular space.

7. A NMR machine according to claim 6,
characterized in that the solenoidal coils are energized by individual electrical power supplies;
characterized in that the solenoidal coils are formed of elongate helicoidal turns, of rectangular profile, along circular conductive sleeves, sleeves of the same coil being concentric and engaged one within another; and
characterized by an annular space between two sleeves configured for a cooling fluid.

8. A NMR machine according to claim 1,
characterized in that the solenoidal coils are distributed at the perimeter of the annular space in 2n arrangements of coaxial solenoidal coils where n is an integer greater than or equal to 3.

9. A NMR machine according to claim 1,
characterized in that the solenoidal coils are distributed at the perimeter of the annular space or the additional annular cylindrical space in 2n arrangements of coaxial solenoidal coils, where n is an integer greater than or equal to 3.

10. A NMR machine according to claim 9,
characterized in that a component of a current that flows in a coil configured to produce a gradient is proportional to a nominal current multiplied by the cosine of an angle that identifies the coil on the perimeter of the annular space.

11. A NMR machine according to claim 4,
characterized in that the additional annular cylindrical space includes on an external wall thereof annular coils configured for producing a magnetic field gradient oriented in the direction of the main magnetic field $B_0$ whereas the solenoidal coils producing X, Y field gradients in directions perpendicular to the direction z of this main magnetic field are all disposed within the thickness of the additional annular cylindrical space.

12. A NMR machine according to claim 1, characterized in that the solenoidal coils are energized by individual electrical power supplies.

13. A NMR machine according to claim 1,
characterized in that the solenoidal coils are formed of elongate helicoidal turns, of rectangular profile, along circular conductive sleeves, sleeves of the same coil being concentric and engaged one within another.

14. A NMR machine according to claim 13, characterized by an annular space between two sleeves configured for a cooling fluid.

15. A nuclear magnetic resonance (NMR) machine comprising
means for creating an intense main magnetic field $B_0$ in a usable interior space in the form of a tunnel with axis Z,
means for radio-frequency excitation and for processing radio-frequency signals emitted in response by a body or object placed in said usable interior space, and
a first set of solenoidal gradient coils for superimposing on the intense magnetic field $B_0$ components of an additional magnetic field, said gradient coils being incorporated into tubes disposed parallel to the axis Z in an annular cylindrical space situated between an exterior cryogenic enclosure containing said means for creating an intense magnetic field $B_0$ and said usable interior space;

the diameter of the gradient coils being inscribed in a thickness of said annular cylindrical space, characterized in that, it further comprises between said exterior cryogenic enclosure and said annular cylindrical space an additional annular cylindrical space in which is disposed a second set of solenoidal gradient coils that are incorporated into tubes disposed parallel to the axis Z, in that the direction of the pulsed currents in the circular solenoidal gradient coils of said second set is reversed relative to the direction of the pulsed currents in the solenoidal gradient coils of said first set in order to create field gradients in the reverse direction that reduce the vector potential and the eddy currents induced in the exterior cryogenic enclosure, in that the solenoidal gradient coils of the first and second sets are configured to produce a first or X field gradient in a first radial direction (x) of the machine perpendicular to the axis Z and a second or Y field gradient in a second radial direction (y) of the machine also perpendicular to the axis Z, the first direction (x) being perpendicular to the second direction (y);

characterized in that the machine includes amplifiers configured for simultaneously energizing said solenoidal coils with algebraic sums of currents corresponding to the two gradients;

characterized in that a solenoidal coil whose diameter is inscribed in the annular cylindrical space is configured to produce a) a Z field gradient in a direction (z) parallel to the main field $B_0$ and is coaxial with another solenoidal coil inscribed in the same tube of this annular cylindrical space and configured to produce b) an X field gradient in a direction (x) perpendicular to the direction (z); and characterized in that a solenoidal coil whose diameter is inscribed in the additional annular cylindrical space and that is configured to produce a) a Z field gradient in a direction (z) parallel to the main field $B_0$ and is coaxial with another solenoidal coil inscribed in the same tube of this additional annular cylindrical space and configured to produce b) an X field gradient in a direction (x) perpendicular to the direction (z).

16. A NMR machine according to claim 15, characterized in that the solenoidal gradient coils incorporated in tubes constitute individual sources of X, Y and Z gradients that are sized as forming part of a set of N contiguous individual sources distributed at the perimeter of the annular cylindrical space, where $N=4\upsilon$, $\upsilon$ being an integer from 2 to 4, but where one in two individual sources is omitted so as to retain only $2\upsilon$ non-contiguous individual sources, each tube being provided with one individual source.

17. A NMR machine according to claim 16, characterized in that the solenoidal coils are distributed at the perimeter of the annular space in 2n arrangements of coaxial solenoidal coils where n is an integer greater than or equal to 3;

characterized in that the solenoidal coils are energized by individual electrical power supplies;

characterized in that the solenoidal coils are formed of elongate helicoidal turns, of rectangular profile, along circular conductive sleeves, sleeves of the same coil being concentric and engaged one within another; and characterized by an annular space between two sleeves configured for a cooling fluid.

18. A NMR machine according to claim 16, characterized in that the solenoidal coils are distributed at the perimeter of the annular space or the additional annular cylindrical space in 2n arrangements of coaxial solenoidal coils, where n is an integer greater than or equal to 3;

characterized in that a component of a current that flows in a coil to produce a gradient is proportional to a nominal current multiplied by the cosine of an angle that identifies the coil on the perimeter of the annular space;

characterized in that the solenoidal coils are energized by individual electrical power supplies;

characterized in that the solenoidal coils are formed of elongate helicoidal turns, of rectangular profile, along circular conductive sleeves, sleeves of the same coil being concentric and engaged one within another; and characterized by an annular space between two sleeves configured for a cooling fluid.

19. A NMR machine according to claim 16, characterized in that the annular space includes contiguous tubes distributed at the perimeter in order to receive the solenoidal coils, the radius a of a tube being given by $a=r1(\sin \pi/N)/(1-\sin \pi/N)=r2(\sin \pi/N)/(1+\sin \pi/N)$, in which formula N represents the number of tubes and r1 and r2 the inside and outside radii, respectively, of the annular space;

characterized in that the solenoidal coils are energized by individual electrical power supplies;

characterized in that the solenoidal coils are formed of elongate helicoidal turns, of rectangular profile, along circular conductive sleeves, sleeves of the same coil being concentric and engaged one within another; and characterized by an annular space between two sleeves configured for a cooling fluid.

* * * * *